(12) United States Patent
Shim et al.

(10) Patent No.: US 10,879,480 B2
(45) Date of Patent: Dec. 29, 2020

(54) LIGHT EMITTING DISPLAY APPARATUS

(71) Applicant: LG Display Co., Ltd., Seoul (KR)

(72) Inventors: Joosung Shim, Paju-si (KR); MooKyoung Hong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/712,368

(22) Filed: Dec. 12, 2019

(65) Prior Publication Data

US 2020/0212332 A1 Jul. 2, 2020

(30) Foreign Application Priority Data

Dec. 28, 2018 (KR) ......................... 10-2018-0172030

(51) Int. Cl.
*H01L 51/50* (2006.01)
*H01L 27/32* (2006.01)
*G09G 3/3225* (2016.01)

(52) U.S. Cl.
CPC ............ *H01L 51/50* (2013.01); *H01L 27/326* (2013.01); *H01L 27/3246* (2013.01); *G09G 3/3225* (2013.01)

(58) Field of Classification Search
CPC ... H01L 51/50; H01L 27/3246; H01L 27/326; G09G 3/3225
See application file for complete search history.

(56) References Cited

U.S. PATENT DOCUMENTS

| | | | |
|---|---|---|---|
| 2007/0080906 A1 | 4/2007 | Tanabe | |
| 2010/0091006 A1 | 4/2010 | Yoo et al. | |
| 2011/0227505 A1* | 9/2011 | Park | H05B 45/60 315/297 |
| 2014/0092114 A1* | 4/2014 | Toksvig | G06T 15/50 345/552 |
| 2017/0061892 A1* | 3/2017 | Jung | G09G 3/3291 |

FOREIGN PATENT DOCUMENTS

| | | |
|---|---|---|
| KR | 10-2016-0055324 A | 5/2016 |
| KR | 10-2017-0065087 A | 6/2017 |
| KR | 10-2018-0047328 A | 5/2018 |

* cited by examiner

*Primary Examiner* — Seahvosh Nikmanesh
(74) *Attorney, Agent, or Firm* — Seed Intellectual Property Law Group LLP (57) ABSTRACT

Disclosed is a light emitting display apparatus which sets black image data, corresponding to a black image displayed after a normal image is displayed, for each pixel in one frame period on the basis of a characteristic of a light emitting display panel.

15 Claims, 4 Drawing Sheets

LIGHT EMITTING DISPLAY APPARATUS

BACKGROUND

Technical Field

The present disclosure relates to a light emitting display apparatus using a black image mode which displays an image and a black image.

Description of the Related Art

In addition to liquid crystal display (LCD) apparatuses, light emitting display apparatuses including a light emitting device such as a light emitting diode have a problem where an image is not clearly seen due to the delay of a motion picture response time (MPRT).

In order to solve such a problem, a black image mode which displays an image and then displays a black image during one frame period is used.

More particularly, in a related art light emitting display apparatus, the same black image data voltages corresponding to a black image are supplied to all pixels.

BRIEF SUMMARY

For light emitting display apparatuses in which the same black image data voltages corresponding to a black image are supplied to all pixels, degrees of degradation of driving transistors included in respective pixels differ, and thus, even when the same black image data voltages are supplied to all of the pixels, all of the pixels do not display the same black images. Due to this, dimming may occur in a portion of a light emitting display panel.

Moreover, when a black image data voltage is supplied to a data line, a reference voltage supplied through a reference voltage line disposed in parallel with the data line in each pixel is coupled to the black image data voltage, and due to this, is shaken. When the reference voltage is shaken, a voltage at a source of the driving transistor is shaken, and due to this, a normal image may not be displayed.

Accordingly, the present disclosure is directed to providing a light emitting display apparatus that substantially obviates one or more problems due to limitations and disadvantages of the related art.

An aspect of the present disclosure is directed to providing a light emitting display apparatus which sets black image data, corresponding to a black image displayed after a normal image is displayed, for each pixel in one frame period on the basis of a characteristic of a light emitting display panel.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with one or more purpose of the disclosure, as embodied and broadly described herein, there is provided a light emitting display apparatus including a light emitting display panel including a pixel including a light emitting device and a driving transistor driving the light emitting device, a controller setting black image data corresponding to a black image displayed through an $n^{th}$ pixel after a normal image is displayed through the $n^{th}$ pixel in one frame period, based on a characteristic value of the light emitting display panel, a storage unit storing the characteristic value generated from the light emitting display panel, a data driver converting pieces of black image data, transferred from the controller, into black image data voltages and outputting the black image data voltages to data lines included in the light emitting display panel, and a gate driver outputting gate signals to gate lines included in the light emitting display panel, based on control by the controller.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

In the specification, in adding reference numerals for elements in each drawing, it should be noted that like reference numerals already used to denote like elements in other drawings are used for elements wherever possible.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 1:
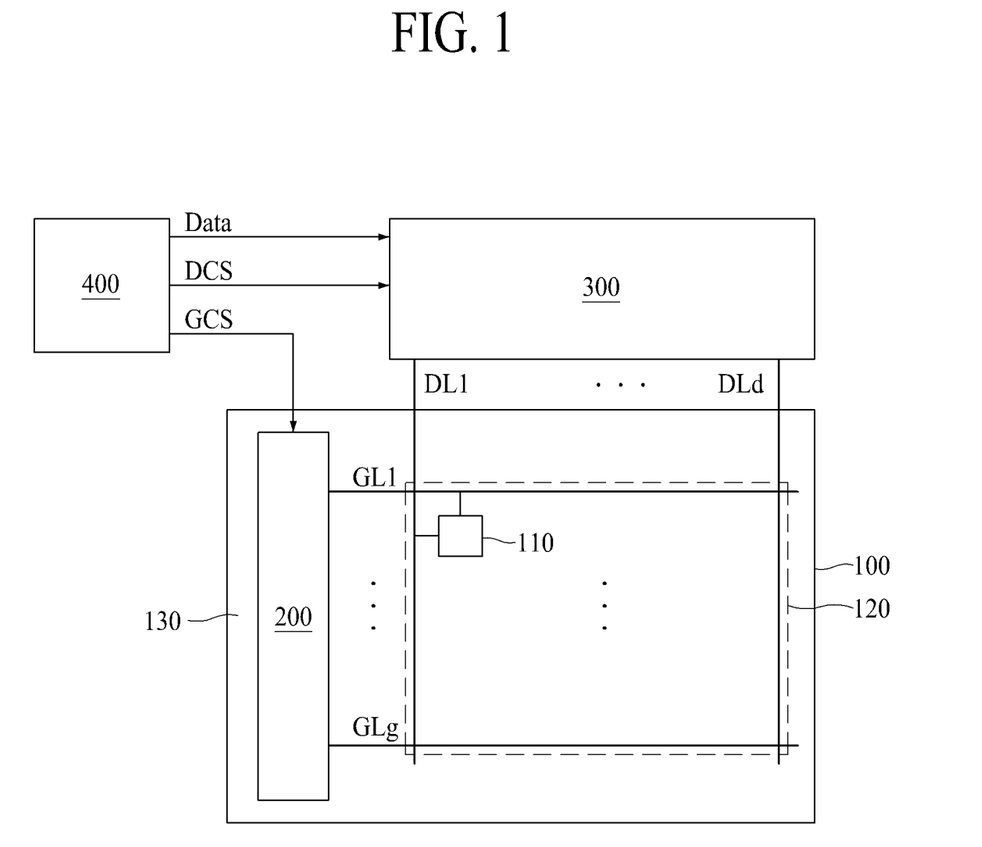
FIG. 1 is an exemplary diagram illustrating a configuration of a light emitting display apparatus according to the present disclosure.
Figure 2:
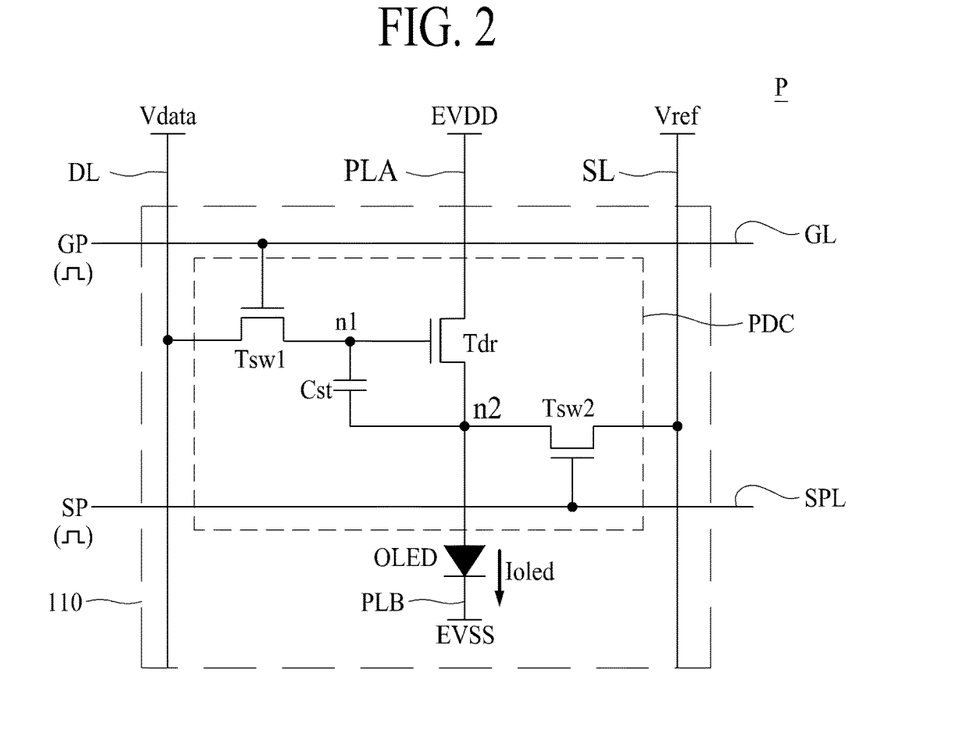
FIG. 2 is an exemplary diagram illustrating a configuration of one pixel of a light emitting display apparatus according to the present disclosure.
Figure 3:
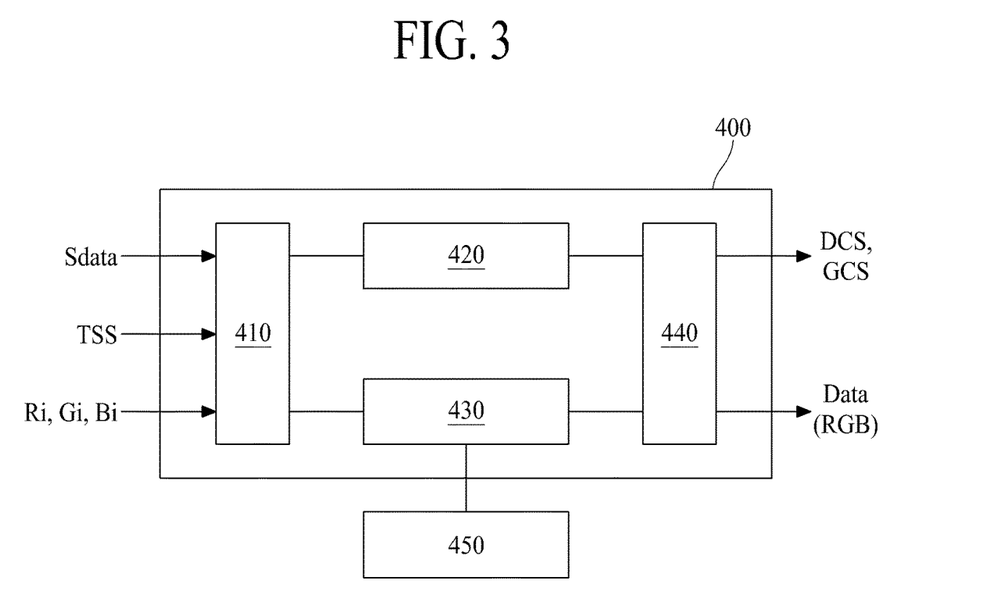
FIG. 3 is an exemplary diagram illustrating a configuration of a controller applied to a light emitting display apparatus according to the present disclosure.

FIG. 1 is an exemplary diagram illustrating a configuration of a light emitting display apparatus according to the present disclosure. FIG. 2 is an exemplary diagram illustrating a configuration of one pixel of a light emitting display apparatus according to the present disclosure. FIG. 3 is an exemplary diagram illustrating a configuration of a controller applied to a light emitting display apparatus according to the present disclosure. Particularly, FIG. 2 is an exemplary diagram illustrating a configuration of an $n^{th}$ pixel P. In the following description, the $n^{th}$ pixel P illustrated in FIG. 2 may be simply referred to as a pixel 110, except a specially desired case.

The light emitting display apparatus according to the present disclosure, as illustrated in FIGS. 1 to 3, may include a light emitting display panel 100 including a pixel 110 which includes a light emitting device ED and a driving transistor Tdr for driving the light emitting device ED, a controller 400 which, in one frame period, sets black image data corresponding to a black image displayed after a normal image is displayed on an $n^{th}$ pixel P, based on a characteristic value of the light emitting display panel 100, a storage unit 450 which stores the characteristic value, a data driver 300 which converts pieces of black image data, transferred from the controller 400, into black image data voltages and outputs the black image data voltages to a plurality of data lines DL1 to DLd included in the light emitting display panel 100, and a gate driver 200 which outputs gate signals to a plurality of gate lines GL1 to GLg included in the light emitting display panel 100, based on control by the controller 400. In various embodiments, the controller 400 may include electrical circuitry configured to perform the various functions of the controller 400 described herein, and in some embodiments, the controller 400 may be or include a microcontroller, microprocessor, application-specific integrated circuit (ASIC), or the like configured to perform the various functions described herein with respect to the controller 400.

Terms used herein will be simply described below. A blank period may denote a period between one frame and another frame. A frame may denote one image. Therefore, the blank period may denote a period between periods where two different images are displayed.

One frame period may denote a period where one image is displayed and may include one blank period between one frame and one other frame. Herein, when the order of one-frame periods is needed, the terms "a first frame period" and "a second frame period" may be used, and when the order of one-frame periods is not needed, the term "one frame period" may be used.

A mode which displays a normal image and then displays a black image during one frame period may be referred to as a black image mode. The black image mode may be used to solve a problem where an image is not clearly seen due to the delay of a motion picture response time (MPRT). In the black image mode, for example, only a normal image desired by a user may be displayed during a fore ½ period of one frame period, and during the other ½ period, the black image and the normal image may all be displayed.

The normal image may denote an image which is provided in order for a user to watch the image, and particularly, may denote an image which is displayed based on light emitted from one pixel 110. The black image may denote an image which is arbitrarily generated by the controller 400 so as to solve a problem caused by the delay of the MPRT, and particularly, may denote an image which is displayed based on black light emitted from the one pixel 110.

Therefore, normal images displayed on all of a plurality of pixels 110 may configure one image.

That is, as described above, in order to solve the problem caused by the delay of the MPRT, the black image may be arbitrarily generated by the controller 400, and the normal image may be displayed by the pixel 110 on the basis of input video data transferred from an external system.

A data voltage Vdata, used to display the normal image, of data voltages Vdata supplied through the data lines DL may be referred to as a normal image data voltage, and a data voltage Vdata used to display the black image may be referred to as a black image data voltage.

The normal image data voltage may be generated by the data driver 300 on the basis of normal image data, and the black image data voltage may be generated by the data driver 300 on the basis of black image data.

The normal image data may be generated based on the input video data and a normal correction value, and the black image data may be generated based on reference black image data and a black correction value. A generic name for the normal image data and the black image data may be image data.

The reference black image data may denote a value which is fundamentally applied to all pixels included in the light emitting display panel, for generating the black image data.

The normal correction value may be generated from a variation amount of a threshold voltage and a variation amount of mobility, and the black correction value may be generated from the variation amount of the threshold voltage (hereinafter simply referred to as a threshold voltage variation amount) or a voltage, having minimum value, of normal image data voltages which are output in one frame period.

The threshold voltage variation amount may be calculated when an electronic device is turned on or off, and the variation amount of mobility (hereinafter simply referred to as a mobility variation amount) may be calculated in the blank period.

Hereinafter, the elements will be described sequentially.

First, as illustrated in FIG. 2, the light emitting display panel 100 may include the plurality of pixels 110 which each include the light emitting device ED and the pixel driving circuit PDC. Also, a plurality of pixel areas where the plurality of pixels 110 are respectively provided may be defined in the light emitting display panel 100, and signal lines through which driving signals are supplied to the pixel driving circuit PDC may be provided in the light emitting display panel 100.

The light emitting device ED may include a first electrode, a light emitting layer, and a second electrode provided on the light emitting layer. The light emitting layer may include one of a blue light emitting part, a green light emitting part, and a red light emitting part, for emitting light of a color corresponding to a color which is set in the pixel 110. The light emitting layer may include one of an organic light emitting layer, an inorganic light emitting layer, and a quantum dot light emitting layer, or may include a stacked or combination structure of the organic light emitting layer (or the inorganic light emitting layer) and the quantum dot light emitting layer.

The signal lines may include a gate line GL, a sensing pulse line SPL, a data line DL, a reference voltage line SL, a first driving power line PLA, and a second driving power line PLB.

A plurality of gate lines GL may be arranged in parallel at certain intervals in a second direction (for example, a widthwise direction) of the light emitting display panel 100.

A plurality of sensing pulse lines SPL may be arranged at certain intervals in parallel with the gate lines GL. A sensing pulse SP may be supplied to the sensing pulse lines SPL.

A plurality of data lines DL may be arranged at certain intervals in parallel in a first direction (for example, a lengthwise direction) of the light emitting display panel 100 to intersect the gate lines GL and the sensing pulse lines SPL. However, an arrangement structure of the data line DL and the gate line LG may be variously modified.

A plurality of reference voltage lines SL may be arranged at certain intervals in parallel with the data lines DL. However, the present disclosure is not limited thereto. For example, at least three pixels 110 may configure one unit pixel, and in this case, one reference voltage line SL may be provided in the one unit pixel.

To provide an additional description, the data lines DL may be provided in the first direction (for example, the lengthwise direction of FIG. 1) of the light emitting display panel 100, and the reference voltage lines SL may be provided in parallel with the data lines DL and may be respectively connected to at least three pixels 110 configuring each of unit pixels provided in one horizontal line.

A reference voltage Vref may be supplied to the reference voltage line SL.

The reference voltage Vref may be used even when the mobility or threshold voltage of the driving transistor Tdr, and in a period where images are displayed, the reference voltage Vref may be supplied to a source of the driving transistor Tdr.

The first driving power line PLA may be provided apart from the data line DL and the sensing line SL by a certain interval in parallel therewith. The first driving power line PLA may be connected to a power supply and may transfer a first driving power EVDD, supplied from the power supply, to each pixel 110.

The second driving power line PBL may be provided in plurality, and each of the second driving power lines PBL may transfer a second driving power EVSS, supplied from the power supply, to a corresponding pixel 110.

The pixel driving circuit PDC may include a driving transistor Tdr which controls a level of a current flowing in the light emitting diode ED, a switching transistor Tsw1 which is connected between the data line DL, the driving transistor Tdr, and the gate line GL, and a sensing transistor Tsw2 for transferring the reference voltage Vref to a source of the driving transistor Tdr, and a capacitor Cst. Also, the pixel driving circuit PDC included in each of the pixels 110 may further include transistors for external compensation.

That is, a structure of the pixel driving circuit PDC may be changed to various structures for performing the external compensation, and a method of driving the pixel driving circuit PDC may also be changed variously.

The external compensation may denote an operation of calculating a variation amount of a threshold voltage or mobility of the driving transistor Tdr provided in the pixel 110 and varying a level of a data voltage supplied to the pixel 110 on the basis of the variation amount. Therefore, in order to calculate the variation amount of the threshold voltage or mobility of the driving transistor Tdr, a structure of the pixel 110 may be changed to various structures.

Moreover, in order to perform the external compensation, a method of calculating the variation amount of the threshold voltage or mobility of the driving transistor Tdr by using the pixel 110 may be variously changed based on the structure of the pixel 110.

In this case, sensing for the external compensation may be performed on one gate line in one vertical blank period and may be performed when an electronic device (for example, a television (TV), a monitor, a smartphone, a table personal computer (PC), or the like) including the light emitting display apparatus is turned on or off.

In the blank period, for example, the variation amount of mobility of the driving transistor Tdr may be sensed, and when the electrode device is turned on or off, the variation amounts of threshold voltages of the driving transistors Tdr may be sensed.

When the electronic device is again turned on, the controller 400 may generate correction values for correcting the variation amounts of threshold voltages of the driving transistors Tdr and may correct pieces of input video data transferred from the external system by using the correction values to generate pieces of normal image data. The pieces of normal image data may be transferred to the data driver 300.

In the blank period, while the variation amount of mobility is being sensed, the reference voltage Vref or another voltage for the sensing may be supplied to the reference voltage line SL.

When the sensing is not performed, the reference voltage Vref may be supplied to the reference voltage line SL and may maintain a voltage at the source of the driving transistor Tdr. Therefore, the reference voltage Vref has to be maintained to have a value within a certain range.

That is, the present disclosure relates to a light emitting display apparatus which uses threshold voltages calculated through the external compensation and does not directly relate to an external compensation method.

Therefore, a structure of each pixel for the external compensation may be implemented as various pixel structures proposed for the external compensation, and a method of performing the external compensation may be implemented as various external compensation methods.

That is, a detailed structure of each pixel for performing the external compensation and a detailed method for the external compensation are irrelevant to the scope of the present disclosure. Therefore, an example of a pixel for the external compensation has been simply described above with reference to FIG. 2, and an external compensation method will be simply described below.

Moreover, the present disclosure may be applied to a light emitting display apparatus including the reference voltage line SL and the sensing transistor Tsw2, for internal compensation. A structure of the pixel 110 including the reference voltage line SL may be changed to various structures, for the internal compensation, and an internal compensation method may be variously changed based on a structure of the pixel 110.

Moreover, as described above, the present disclosure may use the black image mode. The structure of the pixel 110 with the black image mode applied thereto may be variously changed based on the black image mode, in addition to the structure illustrated in FIG. 2.

That is, FIG. 2 illustrates the structure of the pixel 110 for performing the external compensation and the black image mode, and thus, the structure of the pixel 110 may be changed to various structures, in addition to the structure illustrated in FIG. 2.

Hereinafter, a light emitting display apparatus including the pixels 110 illustrated in FIG. 2 will be described as an example of the present disclosure.

Second, the gate driver 200 may sequentially supply a gate-on signal GP to a plurality of gate lines GL1 to GLg included in the light emitting display panel 100 by using gate control signals GCS transferred from the controller 400. The gate control signals GCS may include n (where n is an integer equal to or more than two) number of gate clocks GCLK.

Here, the gate-on signal GP may denote a signal for turning on the switching transistor Tsw1 connected to a corresponding gate line of the gate lines GL1 to GLg. A signal for turning off the switching transistor Tsw1 may be referred to as a gate-off signal. A generic name for the gate-on signal GP and the gate-off signal may be a gate signal.

The gate driver 200 may be provided independently from the light emitting display panel 100 and may be connected to the light emitting display panel 100 through a tape carrier package (TCP), a chip-on film (COF), or a flexible printed circuit board (FPCB), but is not limited thereto. In other embodiments, the gate driver 200 may be directly provided outside the light emitting display panel 100 by using a gate-in panel (GIP) type, based on a process of manufacturing the pixel driving circuit PDC.

Third, the power supply may supply power to the gate driver 200, the data driver 300, and the controller 400.

Fourth, the data driver 300 may convert pieces of normal image data Data, transferred from the controller 400, into normal data voltages Vdata and may supply the normal data voltages to the data lines DL1 to DLd.

Fifth, the controller 400 may control the gate driver 200 and the data driver 300.

The controller 400, as illustrated in FIG. 3, may generate a gate control signal GCS for controlling driving of the gate driver 200 and a data control signal DCS for controlling driving of the data driver 300 by using a timing synchronization signal TSS input from the external system.

Moreover, in a sensing mode where sensing for the external compensation is performed, the controller 400 may transfer pieces of sensing image data, which are to be supplied to pixels connected to a gate line on which the external compensation is performed, to the data driver 300.

Sensing for the external compensation may be performed at various timings. For example, the variation amounts of mobility of the driving transistors Tdr may be sensed in the blank period, and when the electronic device is turned on or off, the variation amounts of mobility of the driving transistors Tdr may be sensed.

The controller 400 may calculate normal correction values on the basis of pieces of sensing data Sdata which are provided from the data driver through the above-described sensing process and may store the normal correction values in the storage unit 450.

In a display period where an image is displayed, the controller 400 may correct pieces of input video data Ri, Gi, and Bi transferred from the external system by using the normal correction values to generate pieces of normal image data. The data driver 300 may convert the pieces of normal image data into normal image data voltages and may supply the normal image data voltages to the data lines DL1 to DLd.

Particularly, at a timing at which the black image is output, the controller 400 may generate pieces of black image data which are to be output to pixels, based on a voltage, having a minimum value, of normal image data voltages which are to be output in one frame period or a threshold variation amount determined based on the sensing data Sdata.

In order to perform the above-described function, as illustrated in FIG. 3, the controller 400 may include a data aligner which realigns the pieces of input video data Ri, Gi, and Bi transferred from the external system by using the timing synchronization signal TSS transferred from the external system and supplies pieces of realigned image data to the data driver 300, a control signal generator 420 which generates the gate control signal GCS and the data control signal DCS by using the timing synchronization signal TSS, a calculator 410 which calculates a normal correction value for compensating for a characteristic variation of the driving transistor Tdr provided in each of the pixels 110 by using the pieces of sensing data Sdata transferred from the data driver 300, the storage unit 450 which stores the normal correction value, and an output unit 440 which outputs, to the data driver 300 or the gate driver 200, pieces of normal image data Data generated by the data aligner 430 and the gate control signal GCS and the data control signal DCS each generated by the control signal generator 200. Each of the calculator 410, control signal generator 420, data aligner 430, and output unit 440 may be implemented in electrical circuitry configured to perform the various functions of the calculator 410, control signal generator 420, data aligner 430, and output unit 440 described herein. In various embodiments, the storage unit 450 may be any computer-readable memory suitable to storage data, such as the normal correction value.

The storage unit 450 may be included in the controller 400, or may be implemented independently from the controller 400 as illustrated in FIG. 3.

The storage unit 450 may store threshold voltages (hereinafter simply referred to as a start threshold voltage) measured from the driving transistors of all pixels 110 of the light emitting display panel 100 in a process of manufacturing the light emitting display panel 100 and threshold voltages of the pixels 110 measured through sensing which is performed when the electronic device is turned off. In this case, in the sensing which is performed when the electronic device is turned off, the threshold voltages of the all pixels 110 included in the light emitting display panel 100 may be sensed, but in some embodiments only threshold voltages of at least two of the all pixels 110 may be sensed.

When the electronic device is turned on or off, the controller 400 may calculate a threshold voltage variation amount of at least one of the all pixels 110 by using the start threshold voltage and the threshold voltage, and the calculated threshold voltage variation amount may be stored in the storage unit 450.

Particularly, in one frame period, the controller 400 may set black image data corresponding to a black image which is displayed after a normal image is displayed on a pixel, based on a characteristic value of the light emitting display panel.

In this case, the controller 400 may correct reference black image data fundamentally applied to the pixels by using a black correction value calculated based on the characteristic value to generate the black image data.

The black correction value may be generated by the calculator 410, and the data aligner 430 may perform a process of converting the reference black image data by using the black correction value to generate the black image data.

Hereinafter, a driving method of the light emitting display apparatus according to the present disclosure will be described with reference to FIGS. 1 to 6.

Figure 4:
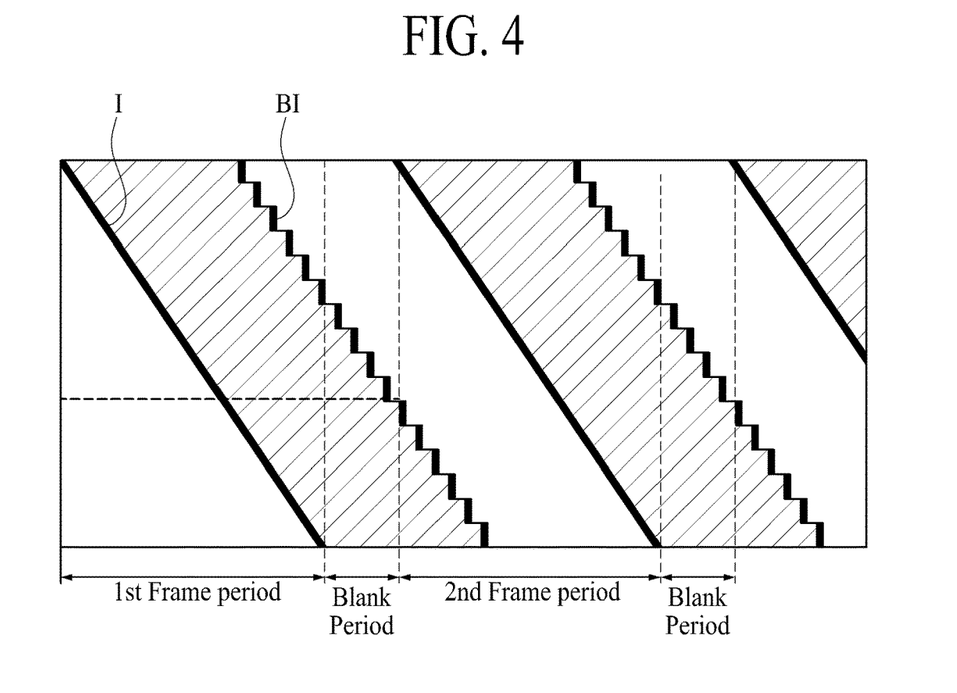
FIG. 4 is an exemplary diagram illustrating a driving period of a light emitting display apparatus according to the present disclosure.
Figure 5:
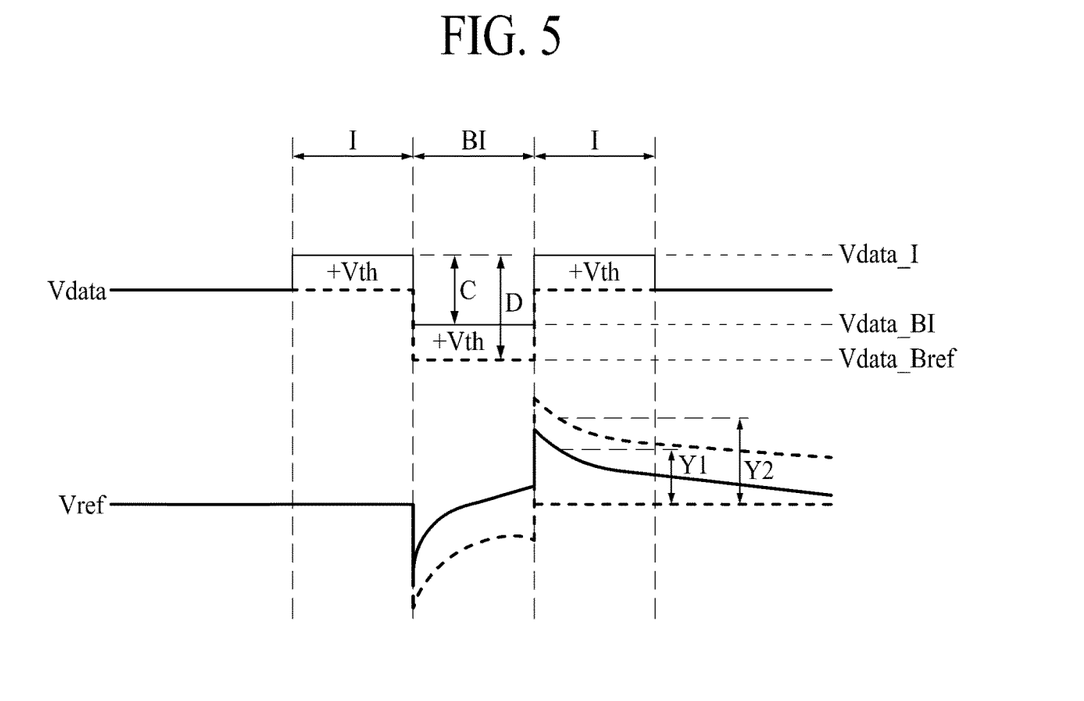
FIG. 5 is an exemplary diagram illustrating data voltages applied to a light emitting display apparatus according to the present disclosure.

FIG. 4 is an exemplary diagram illustrating a driving period of a light emitting display apparatus according to the present disclosure, and FIG. 5 is an exemplary diagram illustrating data voltages applied to a light emitting display apparatus according to the present disclosure. Hereinafter, descriptions which are the same as or similar to descriptions given above with reference to FIGS. 1 to 3 are omitted or will be simply given.

A driving method of the light emitting display apparatus will be described below.

First, as shown in FIG. 4, when a first frame period starts, the controller 400 may convert pieces of input video data, transferred from the external system, into pieces of normal image data by using the normal correction values.

The controller 400 may transfer the pieces of normal image data to the data driver 300.

Subsequently, the data driver 300 may convert the pieces of normal image data into normal image data voltages Vdata_I and may output the normal image data voltages Vdata_I to the data lines DL1 to DLd.

Therefore, as shown in FIG. 4, a normal image I may be sequentially output along the gate lines.

For example, as illustrated in FIG. 2, when a threshold voltage of an N-type driving transistor Tdr included in the pixel driving circuit PDC configuring an $n^{th}$ pixel P is shifted in a positive direction, in order for the $n^{th}$ pixel P to output an image having luminance which is the same as luminance before the threshold voltage is shifted, as illustrated in FIG. 5, a normal image data voltage Vdata_I where a threshold voltage amount "ΔVth" is added to a data voltage Vdata corresponding to the input video data may be supplied to the data line.

Subsequently, when a predetermined or selected period elapses after the normal image data voltage Vdata_I is output through the $n^{th}$ pixel P, a black image data voltage Vdata_BI may be output from the $n^{th}$ pixel P.

To this end, the controller 400 may generate black image data corresponding to the black image data voltage Vdata_BI where the threshold voltage amount "ΔVth" is added to a reference black image data voltage Vdata_Bref.

To this end, the controller 400 may generate a black correction value by using the threshold voltage amount "ΔVth" of the driving transistor Tdr included in the $n^{th}$ pixel P.

The controller 400 may correct the reference black image data by using the black correction value to generate the black image data.

The controller 400 may transfer the black image data to the data driver 300.

That is, in an embodiment illustrated in FIG. 5, in one frame period, the controller 400 may set black image data corresponding to the black image which is output after the normal image is output though the $n^{th}$ pixel P, based on the characteristic value of the light emitting display panel, and particularly, a threshold voltage variation amount of a driving transistor included in the $n^{th}$ pixel may be used as the characteristic value.

Finally, the data driver 300 may convert the black image data into the black image data voltage Vdata_BI and may supply the black image data voltage Vdata_BI to a data line DL connected to the $n^{th}$ pixel P.

The black image data voltage Vdata_BI generated by the data driver 300 on the basis of the black image data corresponding to the $n^{th}$ pixel P may be a voltage which increases by the threshold voltage variation amount "ΔVth" of the pixel in comparison with the reference black image data voltage Vdata_Bref applied to the all pixels included in the light emitting display panel 100. In this case, the black image data voltage may be a voltage which decreases by the threshold voltage variation amount "ΔVth" of the pixel in comparison with the reference black image data voltage Vdata_Bref, based on the kind and current/voltage characteristic of a semiconductor included in the driving transistor.

Hereinafter, a light emitting display apparatus where the black image data voltage increases by the threshold voltage variation amount of the pixel in comparison with the reference black image data voltage will be described as an example of the present disclosure.

In this case, a difference C between the black image data voltage Vdata_BI and the normal image data voltage Vdata_I may be less than a difference D between the reference black image data voltage Vdata_Bref and the normal image data voltage Vdata_I.

The reference voltage Vref supplied to the reference voltage line SL may maintain a voltage at the source of the driving transistor Tdr when the normal image data voltage Vdata_I and the black image data voltage Vdata_BI are output to the data line DL.

However, the reference voltage line SL may be adjacent to the data line DL, and thus, as illustrated in FIG. 5, the reference voltage Vref supplied through the reference voltage line SL may be coupled to a data voltage supplied through the data line and may be shaken.

In this case, since the difference C between the black image data voltage Vdata_BI and the normal image data voltage Vdata_I may be less than the difference D between the reference black image data voltage Vdata_Bref and the normal image data voltage Vdata_I, a threshold voltage variation amount Y1 when the black image data voltage Vdata_BI is supplied to the data line DL may be less than a threshold voltage variation amount Y2 when the reference black image data voltage Vdata_Bref is supplied to the data line DL.

Therefore, when another normal image data voltage Vdata_I is output to the $n^{th}$ pixel P in a second frame period after the black image data voltage Vdata_BI is output, a reference voltage which is within a predetermined or selected range may be supplied to the source of the driving transistor Tdr.

Therefore, the $n^{th}$ pixel P may display an image having brightness predicted based on the other normal image data voltage Vdata_I.

Therefore, a luminance defect may not occur in the light emitting display panel 100.

In a period where the black image data voltage Vdata_BI is supplied, black image data voltages Vdata_BI respectively applied to the pixels 110 of the light emitting display panel 100 may differ.

That is, a voltage which is supplied to each of the pixels 110 in the period where the black image data voltage Vdata_BI is supplied may be a black image data voltage Vdata_BI in which the threshold voltage variation amount "ΔVth" of the pixel 110 is reflected. Therefore, when the threshold voltage variation amounts "ΔVth" of the pixels 110 differ, black image data voltages Vdata_BI respectively applied to the pixels 110 may differ. In this case, a precise black image data voltage Vdata_BI in which a pixel-based feature of the light emitting display panel 100 is reflected may be applied.

However, in the period where the black image data voltage Vdata_BI is supplied, the black image data voltages Vdata_BI respectively applied to the pixels 110 of the light emitting display panel 100 may be the same voltages.

For example, the controller 400 may calculate an average threshold voltage variation amount of the threshold voltage variation amounts "ΔVth" of the pixels 110 and may reflect the calculated average threshold voltage variation amount in the black image data voltage Vdata_BI. In this case, the black image data voltages Vdata_BI respectively applied to the pixels 110 may be the same voltages.

In this case, the black image data voltages Vdata_BI which are to be respectively applied to the pixels 110 may not be calculated. Therefore, even when the black image data voltage Vdata_BI is supplied, the light emitting display apparatus according to the present disclosure may be quickly driven.

Here, the average threshold voltage variation amount may be an average of threshold voltage variation amounts of all pixels 110 included in the light emitting display panel 100, or may be an average of threshold voltage variation amounts of at least two of the all pixels 110. For example, in a case where the threshold voltage variation amount is calculated from only some of the all pixels 110 included in the light emitting display panel 100, the average threshold voltage variation amount may be an average of the calculated threshold voltage variation amounts.

Figure 6:
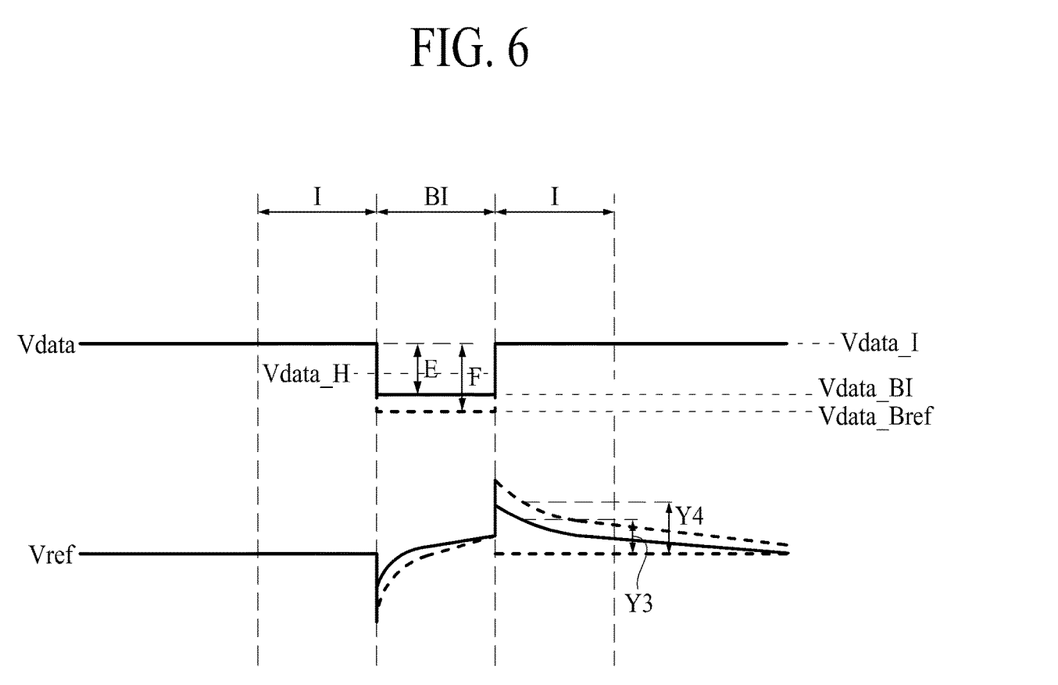
FIG. 6 is another exemplary diagram illustrating data voltages applied to a light emitting display apparatus according to the present disclosure.

FIG. 6 is another exemplary diagram illustrating data voltages applied to a light emitting display apparatus according to the present disclosure.

Hereinafter, descriptions which are the same as or similar to descriptions given above with reference to FIGS. 1 to 5 are omitted or will be simply given.

A driving method of the light emitting display apparatus will be described below.

First, as shown in FIG. 4, when a first frame period starts, the controller 400 may convert pieces of input video data, transferred from the external system, into pieces of normal image data by using the normal correction values.

The controller 400 may transfer the pieces of normal image data to the data driver 300.

Subsequently, the data driver 300 may convert the pieces of normal image data into normal image data voltages Vdata_I and may output the normal image data voltages Vdata_I to the data lines DL1 to DLd.

Therefore, as shown in FIG. 4, a normal image I may be sequentially output along the gate lines.

For example, as illustrated in FIG. 2, when a threshold voltage of an N-type driving transistor Tdr included in the pixel driving circuit PDC configuring an $n^{th}$ pixel P is shifted in a positive direction, in order for the $n^{th}$ pixel P to output an image having luminance which is the same as luminance before the threshold voltage is shifted, as illustrated in FIG. 5, a normal image data voltage Vdata_I where a threshold voltage amount "ΔVth" is added to a data voltage Vdata corresponding to the input video data may be supplied to the data line. In FIG. 5, the threshold voltage amount "ΔVth" is shown in a graph showing the data voltage Vdata, but in FIG. 6, a normal image data voltage Vdata_I to which a threshold voltage amount "ΔVth" is added is shown as the data voltage Vdata.

Subsequently, when a predetermined or selected period elapses after the normal image data voltage Vdata_I is output through the $n^{th}$ pixel P, a black image data voltage Vdata_BI may be output from the $n^{th}$ pixel P.

To this end, the controller 400 may generate black image data corresponding to a black image data voltage Vdata_BI which is set based on a voltage, having a minimum value, of normal image data voltages which are output from the all pixels of the light emitting display panel in one frame period where the black image data is output.

To this end, the controller 400 may generate the black correction value by using the voltage, having the minimum value, of normal image data voltages which are output from the all pixels of the light emitting display panel in one frame period where the black image data is output. That is, a characteristic value of the light emitting display panel 100 which is used for the controller 400 to generate the black correction value may be the minimum value.

The controller 400 may correct the reference black image data by using the black correction value to generate the black image data.

The controller 400 may transfer the black image data to the data driver 300.

Finally, the data driver 300 may convert the black image data into the black image data voltage Vdata_BI and may supply the black image data voltage Vdata_BI to a data line DL connected to the $n^{th}$ pixel P.

In this case, the black image data voltage Vdata_BI generated by the data driver 300 on the basis of black image data corresponding to the $n^{th}$ pixel P may be greater than the reference black image data voltage Vdata_Bref applied to all of the pixels 110 included in the light emitting display panel 100 and may be less than the minimum value.

Moreover, the black image data voltage Vdata_BI generated by the data driver 300 on the basis of black image data corresponding to the $n^{th}$ pixel P may be greater than the reference black image data voltage Vdata_Bref and may be less than a predetermined or selected highest black image data voltage Vdata_H, and when the minimum value is greater than the highest black image data voltage Vdata_H, the black image data voltage Vdata_BI may be the highest black image data voltage Vdata_H.

For example, when the highest black image data voltage Vdata_H has a highest value among data voltages capable of expressing black, that a voltage having a minimum value among normal image data voltages Vdata_I output in one frame period is greater than the highest black image data voltage Vdata_H may denote that an image displayed based on the minimum value does not express black.

Therefore, when the minimum value is greater that a value of the highest black image data voltage Vdata_H, the black image data voltage Vdata_BI may be the highest black image data voltage Vdata_H.

In this case, a difference E between the black image data voltage Vdata_BI and the normal image data voltage Vdata_I may be less than a difference F between the reference black image data voltage Vdata_Bref and the normal image data voltage Vdata_I.

The reference voltage Vref supplied to the reference voltage line SL may maintain a voltage at the source of the driving transistor Tdr when the normal image data voltage Vdata_I and the black image data voltage Vdata_BI are output to the data line DL.

However, the reference voltage line SL may be adjacent to the data line DL, and thus, as illustrated in FIG. 5, the reference voltage Vref supplied through the reference voltage line SL may be coupled to a data voltage supplied through the data line and may be shaken.

In this case, since the difference E between the black image data voltage Vdata_BI and the normal image data voltage Vdata_I may be less than the difference F between the reference black image data voltage Vdata_Bref and the normal image data voltage Vdata_I, a threshold voltage variation amount Y3 when the black image data voltage Vdata_BI is supplied to the data line DL may be less than a threshold voltage variation amount Y4 when the reference black image data voltage Vdata_Bref is supplied to the data line DL.

Therefore, when another normal image data voltage Vdata_I is output to the $n^{th}$ pixel P in a second frame period after the black image data voltage Vdata_BI is output, a reference voltage which is within a predetermined or selected range may be supplied to the source of the driving transistor Tdr.

Therefore, the $n^{th}$ pixel P may display an image having brightness predicted based on the other normal image data voltage Vdata_I.

Therefore, a luminance defect may not occur in the light emitting display panel 100.

In the present disclosure, a difference between the normal image data voltage Vdata_I and the black image data voltage Vdata_BI may decrease, and thus, shaking of the reference voltage Vref coupled to the normal image data voltage Vdata_I and the black image data voltage Vdata_BI may be reduced.

Since shaking of the reference voltage Vref is reduced, the reference voltage Vref which is within a certain range may be supplied to the source of the driving transistor Tdr to which the reference voltage Vref is supplied, and thus, a difference voltage between the source and a gate of the driving transistor Tdr may stably vary based on the normal image data voltage Vdata_I.

Therefore, a current passing through the driving transistor Tdr may vary based on the normal image data voltage Vdata_I, and thus, an image having brightness corresponding to the normal image data voltage Vdata_I may be displayed by using the light emitting device ED.

As described above, according to the present disclosure, black image data for displaying a black image may be set for each pixel on the basis of the characteristic of the light emitting display panel.

That is, according to the present disclosure, a black image data voltage for displaying the black image may be set based on a variation amount of a threshold voltage of a driving transistor included in a pixel, and thus, a difference between a normal image data voltage for displaying a normal image and the black image data voltage for displaying the black image may be reduced.

Moreover, according to the present disclosure, the black image data voltage for displaying the black image may be set to a voltage, which is close to a minimum value, of normal image data voltages for displaying the normal image, and thus, a difference between the normal image data voltage for displaying the normal image and the black image data voltage for displaying the black image may be reduced.

Therefore, a reference voltage supplied to a reference voltage line provided in parallel with a data line may decrease in coupled size due to a difference between data voltages supplied to the data line, and thus, image quality may be enhanced.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A light emitting display apparatus, comprising:
  a light emitting display panel including a plurality of pixels, each of the pixels including a light emitting device and a driving transistor driving the light emitting device;
  a controller setting black image data corresponding to a black image displayed through an $n^{th}$ pixel of the plurality of pixels after a normal image is displayed through the $n^{th}$ pixel in one frame period, based on a characteristic value of the light emitting display panel;

a storage unit storing the characteristic value generated from the light emitting display panel;

a data driver converting pieces of black image data, transferred from the controller, into black image data voltages and outputting the black image data voltages to data lines included in the light emitting display panel; and a gate driver outputting gate signals to gate lines included in the light emitting display panel, based on control by the controller, wherein the characteristic value is a threshold voltage variation amount of a driving transistor included in at least one of the plurality of pixels of the light emitting display panel, and the controller generates the black image data corresponding to the $n^{th}$ pixel by using the threshold voltage variation amount.

2. The light emitting display apparatus of claim 1, wherein the threshold voltage variation amount used to generate the black image data corresponding to the $n^{th}$ pixel is a threshold voltage variation amount of a driving transistor included in the $n^{th}$ pixel.

3. The light emitting display apparatus of claim 1, wherein the threshold voltage variation amount is generated after an apparatus turn-off signal is received from an external system, and is stored in the storage unit.

4. The light emitting display apparatus of claim 1, wherein the storage unit stores a start threshold voltage measured from the at least one pixel in a process of manufacturing the light emitting display panel and a threshold voltage which is measured from the at least one pixel after an apparatus turn-off signal is received, and the controller calculates the threshold voltage variation amount by using the start threshold voltage and the threshold voltage.

5. The light emitting display apparatus of claim 1, wherein a black image data voltage generated by the data driver on basis of black image data corresponding to the $n^{th}$ pixel is a voltage which varies by the threshold voltage variation amount of the at least one pixel in comparison with a reference black image data voltage applied to all of the plurality of pixels included in the light emitting display panel.

6. The light emitting display apparatus of claim 1, wherein pieces of black image data corresponding to all of the plurality of pixels included in the light emitting display panel are not equal.

7. The light emitting display apparatus of claim 1, wherein the threshold voltage variation amount applied to the $n^{th}$ pixel is an average of threshold voltage variation amounts of at least two of the driving transistors included in the light emitting display panel.

8. The light emitting display apparatus of claim 7, wherein the controller generates the pieces of black image data corresponding to all of the plurality of pixels included in the light emitting display panel, based on the average.

9. The light emitting display apparatus of claim 1, wherein the pieces of black image data corresponding to all of the plurality of pixels included in the light emitting display panel, based on the average are equal.

10. A light emitting display apparatus, comprising:

a light emitting display panel including a plurality of pixels, each of the pixels including a light emitting device and a driving transistor driving the light emitting device;

a controller setting black image data corresponding to a black image displayed through an $n^{th}$ pixel of the plurality of pixels after a normal image is displayed through the $n^{th}$ pixel in one frame period, based on a characteristic value of the light emitting display panel;

a storage unit storing the characteristic value generated from the light emitting display panel;

a data driver converting pieces of black image data, transferred from the controller, into black image data voltages and outputting the black image data voltages to data lines included in the light emitting display panel; and a gate driver outputting gate signals to gate lines included in the light emitting display panel, based on control by the controller, wherein the characteristic value is a minimum value among values of pieces of normal image data voltages which are output to all of the plurality of pixels included in the light emitting display panel in one frame period, and the controller generates the black image data by using the minimum value.

11. The light emitting display apparatus of claim 10, wherein a black image data voltage generated by the data driver on basis of black image data corresponding to the $n^{th}$ pixel is greater than a reference black image data voltage applied to all of the plurality of pixels included in the light emitting display panel and is less than the minimum value.

12. The light emitting display apparatus of claim 10, wherein a black image data voltage generated by the data driver on basis of black image data corresponding to the $n^{th}$ pixel is greater than a reference black image data voltage and is less than a selected highest black image data voltage.

13. The light emitting display apparatus of claim 12, wherein, when the minimum value is greater than the highest black image data voltage, the black image data voltage is the highest black image data voltage.

14. A display device, comprising:

a light emitting display panel including a plurality of pixels, each of the pixels including a light emitting device and a driving transistor configured to drive the light emitting device;

a computer-readable memory configured to store a threshold voltage variation amount of the driving transistors of each of the plurality of pixels of the light emitting display panel;

controller circuitry coupled to the computer-readable memory and configured to:

generate a black correction value based on the threshold voltage variation amount of the driving transistor of at least one pixel of the plurality of pixels;

generate black image data for display by the at least one pixel after a normal image is displayed by the at least one pixel in one frame period, the black image data generated by adding the black correction value to reference black image data; and a data driver configured to convert the black image data into a black image data voltage and output the black image data voltage to a data line connected to the at least one pixel.

15. The device of claim 14, wherein the computer-readable memory stores a start threshold voltage measured from the at least one pixel in a process of manufacturing the light emitting display panel and a threshold voltage which is measured from the at least one pixel after an apparatus turn-off signal is received, and the controller circuitry is configured to calculate the threshold voltage variation amount based on the start threshold voltage and the threshold voltage.

\* \* \* \* \*